United States Patent [19]

Reiter

[11] 4,335,392

[45] Jun. 15, 1982

[54] SEMICONDUCTOR DEVICE WITH AT LEAST TWO SEMICONDUCTOR ELEMENTS

[75] Inventor: Karl Reiter, Mannheim, Fed. Rep. of Germany

[73] Assignee: Brown, Boveri & Cie Aktiengesellschaft, Mannheim, Fed. Rep. of Germany

[21] Appl. No.: 175,208

[22] PCT Filed: Mar. 6, 1979

[86] PCT No.: PCT/DE79/00020

§ 371 Date: Nov. 21, 1979

§ 102(e) Date: Nov. 21, 1979

[87] PCT Pub. No.: WO79/00817

PCT Pub. Date: Oct. 18, 1979

[30] Foreign Application Priority Data

Mar. 23, 1978 [DE] Fed. Rep. of Germany ... 7808801[U]

[51] Int. Cl.³ .................... H01L 23/16; H01L 23/32; H01L 29/74

[52] U.S. Cl. ........................... 357/75; 357/74; 357/38; 357/72; 357/68; 357/76

[58] Field of Search .................. 357/74, 75, 38, 68, 357/72, 76

[56] References Cited

U.S. PATENT DOCUMENTS 3,371,227  2/1968  Sylvan .................................. 357/75
3,447,057  5/1969  Brown et al. ........................ 357/75
3,486,103  12/1969  Boksjo ................................. 357/75
3,539,875  11/1970  Fong et al. ........................... 357/75
3,566,211  2/1971  Svedberg ............................. 357/38
3,699,406  10/1972  Mapother et al. ................... 357/38
3,975,758  8/1976  Schlegel ............................... 357/75

Primary Examiner—Andrew J. James
Attorney, Agent, or Firm—Herbert L. Lerner; Laurence A. Greenberg

[57] ABSTRACT

Semiconductor device, including a housing having a surface, at least two semiconductor elements in the form of wafers at least one of which being controllable, electrodes for the semiconductor elements being insulated and passivated at the rims thereof and being electrically connected to each other, the electrodes being in the form of main anode and cathode terminals as well as a main center tap terminal provided if the semiconductor elements are connected in series, and control terminals, each of the terminals being disposed so as to extend through the surface of the housing, and an additional auxiliary cathode connection terminal disposed in the housing and extending through the surface thereof as separate terminals in each cathode of the controllable semiconductor elements, each of the auxiliary cathode terminals and the corresponding control terminal of each of the semiconductor elements being disposed adjacent to one of the main terminals and relatively far from each other.

5 Claims, 7 Drawing Figures

SEMICONDUCTOR DEVICE WITH AT LEAST TWO SEMICONDUCTOR ELEMENTS

BACKGROUND OF THE INVENTION

1. Field of the Invention

The invention relates to a semiconductor device with at least two semiconductor elements of which at least one can be controlled, in form of semiconductor elements which are insulated, respectively passivated at their rim, and provided with electrodes, being electrically connected with each other and arranged in a common housing, whereby two main terminals for connecting the anode and cathode, and another main terminal being the center tap with the semiconductor elements in series and, finally, the control terminal are all brought out of the housing at one side.

2. Description of the Prior Art

In known semiconductor devices controllable and non-controllable semiconductor components, i.e. thyristors and diodes, may be combined in a housing into a so-called module. According to the respective applications, the two semiconductor elements are arranged parallel, antiparallel or in series. In the parallel- or anti-parallel arrangement, two terminals are brought out of the housing, for example, as anode- and cathode terminal. When the two semiconductor elements are connected in series, a third main terminal is provided as a center tap. Thereby the main terminals are disposed in a row, and the center tap is spatially positioned at the end of this row. The connecting leads to the control electrodes are made in the form of screw- or plug in connections, with a corresponding lesser cross-section. ("Power Semiconductors" of March 1974 by the firm AEI Semiconductors (Publication 111) pages 48/49; furthermore "Datenblatt Thyristor moduln"Thy F 75/ G 75/ H 75 of Siemens AG, Erlangen). This arrangement has the advantage that when for example, two modules with two semiconductor elements in series in each are used for building a full-wave rectifier bridge, the two center taps are easily accessible for the connection of the alternating current lines.

The inside construction of these semiconductor devices is known, for example, from German Petty Pat. No. DE-Gm 75 12 573 and German Published, Non-prosecuted Application No. DE-OS 23 37 694.

For the connection between the trigger pulse generator and the thyristor, two leads are required, whereby one lead goes to the control electrode, and the other lead goes to the cathode, if the trigger pulse is applied as usual to the control electrode-cathode gap, as is usually done. Because the main terminals, which lead to the anodes and cathodes, and the trigger terminals which lead to the control electrodes have very different wire cross sections, and also show a variety of different connection techniques, problems do arise and so do additional costs when such devices are used. Thyristor devices that are presently marketed are approximately 20 mm wide, and have a plug-in system for the trigger leads (compare data sheet of the firm Semicron Gesellschaft für Gleichrichterbau und Elektronik mgH, Nürnberg: SKKT 40, SKKH40). Thereby, the terminals G1 and G2 have the form of either a Faston-plug 2.8 mm×0.8 mm or of round plugs.

SUMMARY OF THE INVENTION

The invention has the object of improving the arrangement described in the beginning, so that the connection of the trigger leads, which lead the trigger-pulses to the controllable semiconductor elements is made easier.

This object is achieved by also bringing out of the housing auxiliary cathode connections of the controllable semiconductor elements as separate terminals, and by arranging the control terminal which belongs to the same semiconductor element adjacently, but relatively far with respect to their relative distance from each other, from the nearest main terminal.

Preferably, there are always a control terminal and an associated auxiliary cathode terminal combined in a common plug socket When several controllable semiconductor elements are combined in one housing, the control terminals and the associated auxiliary cathode terminals are either combined in a single multipole plug-socket or in several two-pole plug-sockets.

BRIEF DESCRIPTION OF THE DRAWING

The FIGS. 1 to 3 show three views of a known and conventional semiconductor device.

Figure 1:
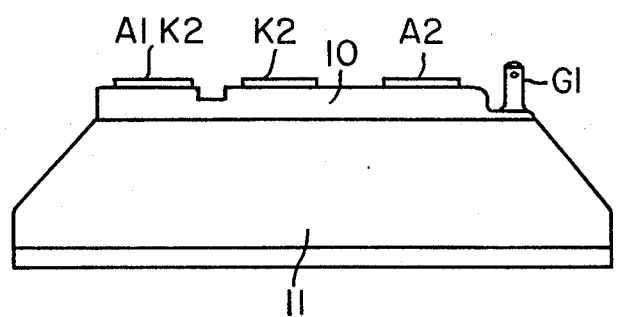
Figure 2:
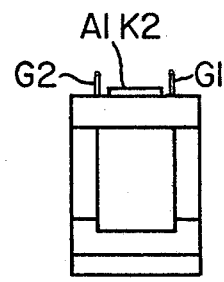
Figure 3:
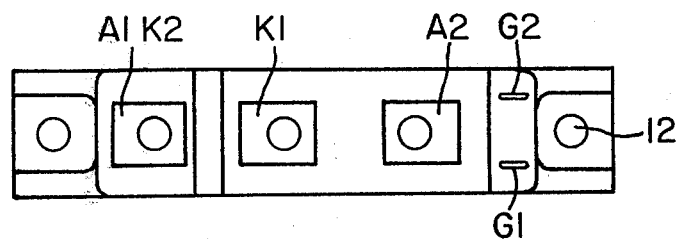

The known semiconductor device shown in FIGS. 1 to 3 contains two in-series connected thyristors in a common housing 11. On the top of the housing is a terminal plate 10, on which (from the left) a center tap A1K2, a cathode terminal K1 and an anode terminal A2 are arranged. Adjacent to the anode terminal A2 are two control-electrode terminals G1, G2 in the form of Faston-plugs. To conduct the trigger pulses to the thyristors, one of the two trigger leads must be clamped (attached) with the plug connector for the control electrodes G1, G2, and the other lead additionally to the associated cathode terminal K1, A1K2. It is obvious that the securing of a connector rail for high current strength, and of a control wire for small current strength at the same cathode terminal creates difficulties. Mounting holes 12 are provided for fastening the semiconductor device to a chassis or heat sink.

DESCRIPTION OF THE PREFERRED EMBODIMENT

Figure 4:
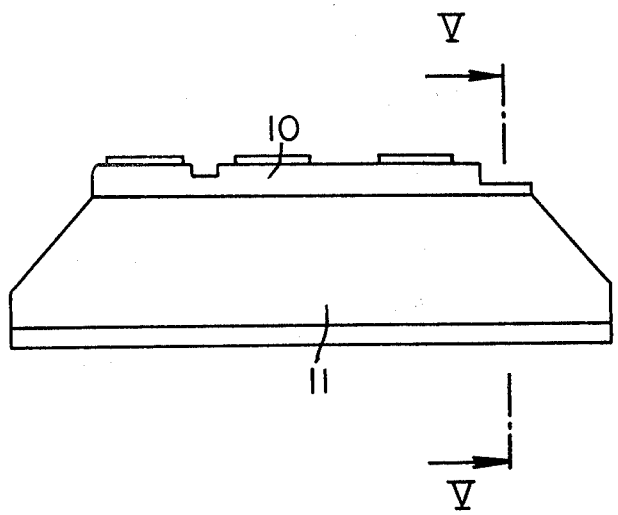
FIG. 4 shows a side view of a semiconductor device with two thyristors according to the invention.
Figure 5:
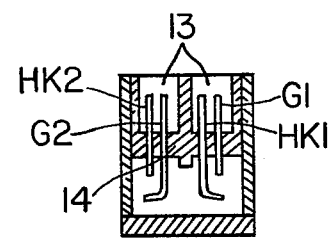
FIG. 5 shows a section of the device of FIG. 4, sectioned along line V—V.
Figure 6:
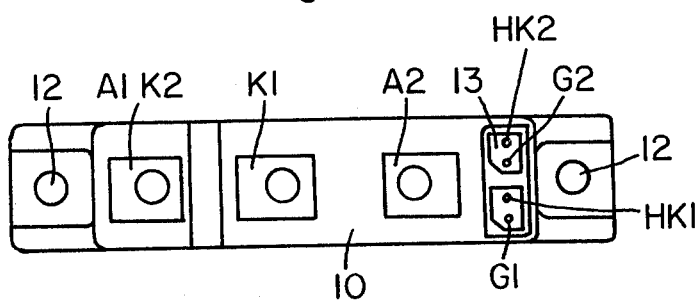
FIG. 6 shows a plan view of the device of FIG. 4.

In the embodiment of the semiconductor device according to the invention, shown in FIGS. 4 to 6, additional auxiliary-cathode terminals HK1 and HK2 are provided closely adjacent to the associated control terminals G1, respectively G2. One control terminal G1, G2 and one auxiliary-cathode terminal HK1, HK2, respectively, are disposed in the form of pins in a plastic socket (13) on the terminal plate 10, these pins perforate the bottom 14 of the socket 13, and are connected inside of the housing with the semiconductor elements by connecting leads which are not shown. The trigger pulses are brought in by double wire leads with a connector (not shown). The form of the connector corresponds with the shape of the socket.

If more than one controllable semiconductor element is arranged in one housing, more than one socket is provided. However, if so desired, a socket with many poles may be provided.

Figure 7:
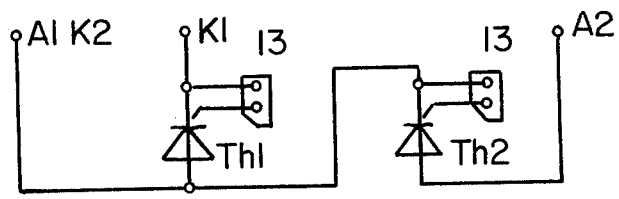
FIG. 7 shows an electrical equivalent schematic of the device of FIG. 4.

With the aid of the electrical equivalent circuit diagram of FIG. 7, one can learn the schematic inner construction of the semiconductor device according to the invention. In the case shown, two thyristors Th1, Th2 are connected in series. In this case there are three main terminals, an anode terminal A2 for the thyristor Th2, a cathode-terminal K1 for the thyristor Th1, and a center-tap A1K2 for the connecting point between the two thyristors Th1, Th2. The cathodes of the two thyristors Th1 and Th2 are additionally brought out as auxiliary cathode terminals, and are combined with the control terminals in the sockets 13.

The semiconductor device according to the invention can be used as a building block (module) for rectifier circuits.

I claim:

1. In a semiconductor device, including a housing having a surface, at least two semiconductor elements in the housing in the form of wafers at least one of which being controllable, electrodes for said semiconductor elements being insulated and passivated at the peripheries of the elements and being electrically connected to each other, said electrodes being in the form of main anode and cathode terminals as well as a main center tap terminal provided if said semiconductor elements are connected in series, said main terminals being provided for connection to relatively heavy wires and to first relatively thin wires, and control terminals for connection to second relatively thin wires, each of said terminals being disposed so as to extend through said surface of said housing, wherein the improvement comprising an additional auxiliary cathode connection terminal disposed in said housing and extending through said surface thereof as separate terminals for each cathode of said controllable semiconductor elements for connection to the first relatively thin wires normally connected to said main terminals, each of said auxiliary cathode terminals and the corresponding control terminal of each of said semiconductor elements being disposed adjacent to one of said main terminals and relatively far from each other.

2. Semiconductor device according to claim 1, including common plug sockets in which said adjacent auxiliary cathode terminal and corresponding control terminal are disposed.

3. Semiconductor device according to claim 1 or 2, including a double plug-in connector having an additional control terminal and an auxiliary cathode terminal spaced apart at a given distance, said first-mentioned adjacent control terminal and auxiliary cathode terminal being spaced apart at said given distance so as to be contactable by said additional terminals.

4. Semiconductor device according to claim 1, including a plug-in connector having additional control and auxiliary cathode terminals spaced apart at a given distance, all of said first-mentioned adjacent control terminals and auxiliary cathode terminals of a plurality of said semiconductor elements being spaced apart at said given distance so as to be simultaneously contactable by said additional terminals.

5. Semiconductor device according to claim 1, wherein said main terminals are relatively large screws and said control and auxiliary cathode terminals are relatively small pins.

* * * * *